United States Patent
Ebihara

Patent Number: 5,107,205
Date of Patent: Apr. 21, 1992

[54] SEMICONDUCTOR DEVICE TESTER WITH A TEST WAVEFORM MONITORING CIRCUIT

[75] Inventor: Sachiko Ebihara, Itami, Japan

[73] Assignee: Mitsubishi Denki Kabushiki Kaisha, Japan

[21] Appl. No.: 599,839

[22] Filed: Oct. 19, 1990

[30] Foreign Application Priority Data

Jul. 25, 1990 [JP] Japan .................. 2-194803

[51] Int. Cl.$^5$ .......................... G01R 31/28
[52] U.S. Cl. .................. 324/158 R; 324/73.1; 364/487; 371/27
[58] Field of Search ............ 324/121 R, 73.1, 158 R; 371/27, 22.5; 364/487, 579, 571.01, 571.04

[56] References Cited

U.S. PATENT DOCUMENTS

| | | | |
|---|---|---|---|
| 4,125,763 | 11/1978 | Drabing et al. | 371/28 |
| 4,194,185 | 3/1980 | Wilson | 364/487 |
| 4,247,941 | 1/1981 | Raymond | 371/27 |
| 4,332,029 | 5/1982 | Campbell | 371/28 |
| 4,497,056 | 1/1985 | Sugamori | 371/25.1 |
| 4,516,119 | 5/1985 | Fukuta | 340/722 |
| 4,584,683 | 4/1986 | Shimizu | 371/27 |
| 4,641,348 | 2/1987 | Neuder et al. | 364/487 |
| 4,642,561 | 2/1987 | Groves et al. | 371/27 |
| 4,764,925 | 8/1988 | Grimes | 371/27 |
| 4,806,852 | 2/1989 | Swan et al. | 371/27 |
| 4,823,076 | 4/1989 | Haines | 364/487 |
| 4,827,437 | 5/1989 | Blanton | 364/571.05 |
| 4,928,278 | 5/1990 | Otsuji et al. | 371/25.1 |
| 4,929,888 | 5/1990 | Yoshida | 371/25.1 |
| 4,977,514 | 12/1990 | Bush | 324/121 R |

*Primary Examiner*—Kenneth A. Weider
*Assistant Examiner*—William J. Burns
*Attorney, Agent, or Firm*—Leydig, Voit & Mayer

[57] ABSTRACT

A tester for semiconductor devices such as IC memory chips is provided with an improved test waveform simulating function. The test waveform simulating circuit comprises relays for selecting one of the outputs of a plurality of drivers. The driver output selected by a relay is compared by a comparator with reference levels at reference times recurring at short intervals, thereby producing information bits corresponding to the waveform of the driver output which is displayed as a two dimensional image through a memory and display.

7 Claims, 3 Drawing Sheets

SEMICONDUCTOR DEVICE TESTER WITH A TEST WAVEFORM MONITORING CIRCUIT

BACKGROUND OF THE INVENTION

This invention relates to testers for testing the performance of semiconductor devices such as memory IC chips, and more particularly to monitoring circuits thereof which display as two-dimensional images the waveforms of the test signals which are input to the semiconductor devices during a dynamic function test thereof.

Testers for semiconductor devices evaluate the performance of semiconductor devices such as memory IC's as follows: Test waveform signals are formed by means of a pattern generator, a timing generator, and a formatter, and are input to a semiconductor device to be tested. Then, the signals which are output in response thereto from the semiconductor devices under test are compared with the expected patterns so as to determine the performance of the semiconductor devices. FIG. 1 shows a block diagram illustrating conceptually the hardware organization of a typical tester for semiconductor devices.

In FIG. 1, a central processing unit (CPU) 1 controls the overall operation of the tester for semiconductor devices. A pattern generator 2 generates various pattern signals, such as test waveforms to be input to the semiconductor devices, and expectation patterns with which the outputs from the semiconductor devices are compared so as to determine whether the device under test (DUT) 6 is functioning well or not. On the other hand, a timing generator 3 generates various timing signals which determine the reference timing needed in the functional test of the device under test 6. Further, a formatter 4 composes the waveforms, generated by the pattern generator 2, and the reference timing determined by the timing generator 3, so as to form test waveforms to be input to the device under test 6. A pin electronics circuit 5, which constitutes an interface for the input and output pins of the device under test 6, comprises drivers (FIG. 2) and comparators (FIGS. 3 and 4) described hereinbelow.

The device under test 6 is a memory IC which comprises a number of pins for inputting and outputting signals thereto and therefrom. In general, most of the pins are input pins via which address or control signals are input to the device under test 6; the output pins from which data signals are output or input/output pins to and out of which data signals are input and output are few in number (generally one, four, or eight, according to the arrangement of the bits within the memory IC).

FIG. 2 is a block diagram which shows the principle of operation of a driver within the pin electronics 5. A driver 7 is provided for each one of the output pins of the tester (which are connected to respective input or input/output pins of the device under test 6). The driver 7 converts the digital test waveform signals generated by the formatter 4, into a waveform pattern in accordance with the voltage levels specified for the device under test 6, so as to apply a high quality waveform to the device under test 6.

On the other hand, FIG. 3 shows a block diagram showing the principle of operation of a comparator within the pin electronics 5. FIG. 4, on the other hand, shows the details thereof. A comparator is provided for each one of the input pins of the tester (connected to the respective output or input/output pins of the device under test 6). The comparator 8 compares the output signal of the device under test 6 with the high reference output voltage level VOH or low reference output voltage level VOL at each reference timing determined by a timing signal (strobe) from the timing generator 3, so as to determine whether the voltage levels and the timing of the output signal of the device under test 6 follow the expected value pattern. Namely, as shown in FIG. 4, the comparator 8 comprises a high comparator 8a and a low comparator 8b, and the circuit or means schematically shown by a block 9 determines, according to the expectation value signal, which, of the high comparator 8a or the low comparator 8b, is put into operation. The timings of the comparison is judgements are determined according to the strobe signal input to the circuit 9. The tester thus evaluates the functional performance of the device under test 6.

If, however, the test waveform input to the device under test 6 is itself deviated from the predetermined waveform pattern and timing, it becomes impossible to evaluate the functional performance of the device under test 6 with high precision. Thus, the output waveform of each one of the driver 7 of the pin electronics circuit be monitored and displayed. As a method of monitoring the output of the drivers 7, one may input the output waveforms of each one of the drivers 7 directly to a comparator. Thus, a tester having a test waveform monitoring function has been developed, wherein each one of the pins is provided with a driver 7 and a comparator 8, as shown in FIG. 5. In FIG. 5, the switch 10 is closed when the output waveform of the driver 7 is to be monitored, so that the output of the driver 7 is input to the comparator 8.

The last mentioned tester with all its pins provided with the input/output function, however, has the following disadvantage. Namely, as pointed out above, most of the pins of memory IC chips are provided exclusively for receiving input signals, and there is no need to provide a comparator for the output pins of the tester which are connected to the input pins of the device under test. In spite of this, each one of the pins of the above tester with the monitoring function is provided with a separate comparator, which makes the circuitry thereof complicated and makes the tester expensive.

SUMMARY OF THE INVENTION

It is therefore a primary object of this invention to provide an inexpensive tester for semiconductor devices for monitoring and simulating the test waveforms with simple circuitry.

The above object is accomplished according to the principle of this invention by a simulation circuit of a tester for semiconductor devices such as memory IC's, which comprises: a driver output selecting means for selecting the output of at least one of the plurality of drivers; and a waveform display means for displaying the waveform of the selected driver output.

Preferably, the waveform display means comprises: waveform holding and repeating means, coupled to the driver output selecting means, for holding a test waveform output from the driver output selecting means and for repeatedly outputting the same waveform; comparator means, coupled to the waveform holding and selecting means, for comparing with a reference level the test waveform output from the waveform holding and repeating means, at reference times recurring at a predetermined time interval which is substantially smaller than the period of the test waveform, thereby obtaining, for each reference level, a row of bits representing the results of comparisons with respect to whether or not the test waveform is above the reference level; reference level varying means for successively varying the reference level each time the test waveform is repeated by the waveform holding and repeating means; memory means, coupled to the comparator means, for storing successive rows of the comparison judgment bits obtained by the comparing means with respect to respective reference levels; and two dimensional display means, coupled to the memory means, for composing into a two-dimensional pattern the successive rows of the comparison judgement bits stored in the memory means, so as to simulate and display the test waveform as a two dimensional image.

Preferably, the comparing means comprises a comparator provided within the tester exclusively for the simulation circuit. Further, it is preferred that the driver output selecting means comprises relays which connect selectively one of the outputs of the drivers to the comparing means.

The simulation circuit according to this invention thus simulates the test waveforms the tester with a simple and inexpensive circuitry. Further, since the test waveforms can be monitored easily without utilizng measurement devices such as an oscilloscope, enhancement of the efficiency of debugging of the test program of the tester is improved.

BRIEF DESCRIPTION OF THE DRAWINGS

The novel features which are believed to be characteristic of this invention are set forth with particularity in the appended claims. This invention itself, however, both as to its organization and method of operation, together with further objects and advantages thereof, may best be understood from the following detailed description, taken in connection with the drawings, in which:

In the drawings, like reference numerals represent like or corresponding parts.

DETAILED DESCRIPTION OF THE PREFERRED EMBODIMENTS

Figure 6:
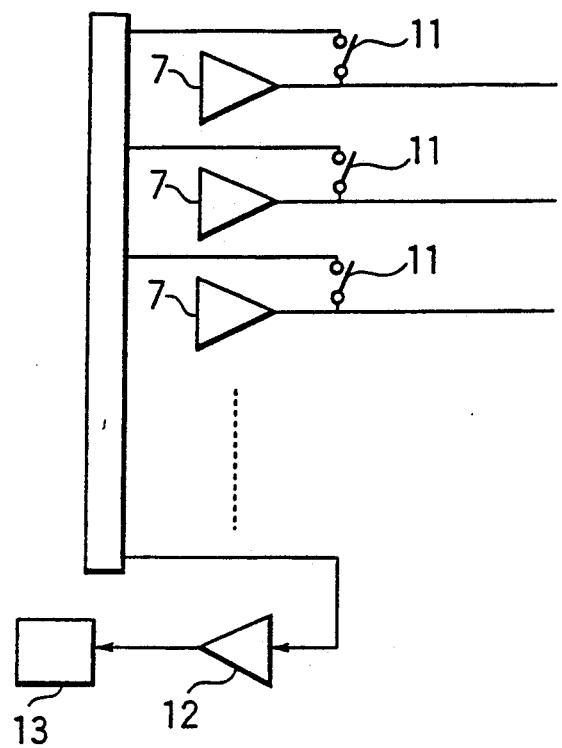
FIG. 6 is a block diagram showing the overall organization of a simulation circuit of a tester according to the invention.

FIG. 6 is a block diagram showing the overall organization of a test waveform signal simulation circuit (or means) of a tester for semiconductor devices according to the invention. The overall organization of the tester is substantially the same as that of the tester of FIG. 1 described above in the introductory portion of this specification. Thus, the description as set forth below is limited to the main part to the simulation circuit of the tester.

As shown in FIG. 6, each one of the drivers 7 of the tester is connected to a comparator 12 via respective relays 11, which relays are included in the driver output selecting means. In the case of this embodiment, the comparator 12 is provided exclusively for the purpose of simulating and monitoring the test waveforms, and is not used during the functional test of a device under test (a memory IC). The output of the comparator 12 is connected to the memory and display means.

Figure 7:
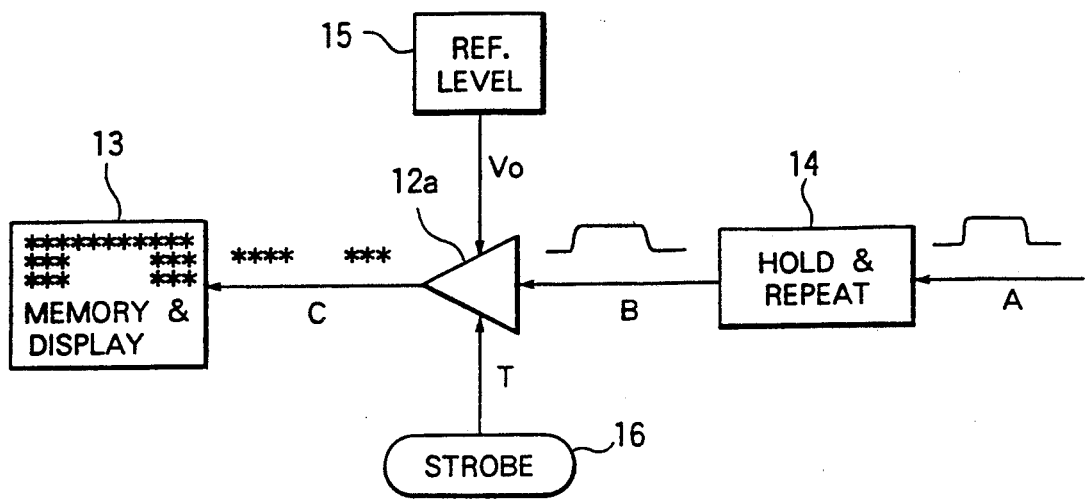
FIG. 7 is a block diagram showing the details of the simulation circuit of FIG. 6.

FIG. 7 is a block diagram showing schematically the details of the functional organization of the comparator 12 of FIG. 6. The blocks 12a and 14 through 16 of FIG. 7 together correspond to the single block 12 of FIG. 6. Referring next to FIGS. 6 and 7, the principle of the method of operation of the test waveform simulation circuit of the tester according to this invention is described.

When a test waveform is to be monitored and simulated, one of the relays 11 is turned on, to connect one of the plurality of drivers 7 to a waveform holding and repeating means 14. The waveform holding and repeating means 14 holds the waveform A output from the driver 7 connected thereto via a relay 11, and repeatedly outputs the same waveform B a number of times (N times). The waveform of the output B of the holding and repeating means 14 is identical to the waveform of the output A from the connected driver.

Figure 8:
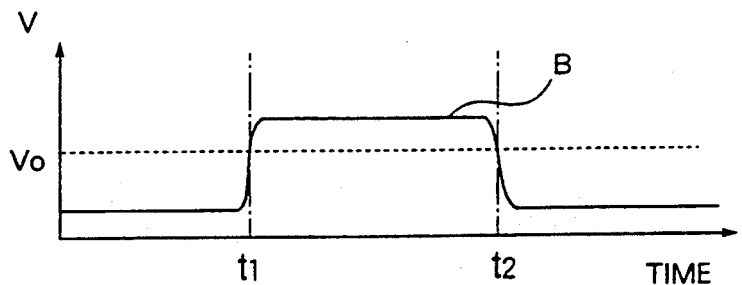
FIG. 8 is a graph showing the method of operation of the comparator of FIG. 7.
Figure 4:
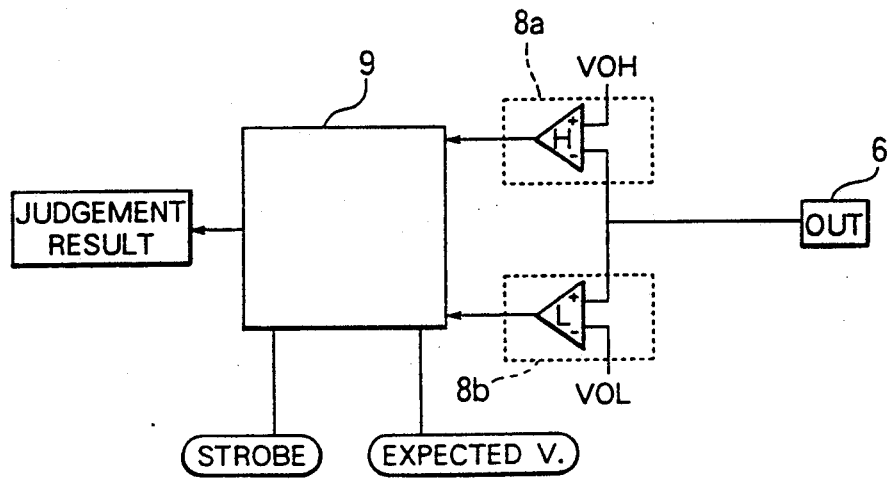

The comparator 12a of FIG. 7, which included a comparing means, compares the waveform B with a reference level VO at each reference times determined by the strobe signal T output from the strobe generator 16. The interval between the comparison times as determined by the strobe T is set at a length which is substantially smaller than the period of the waveform B. The comparator 12a outputs the result of the comparison C to the memory and display means 13. This result of comparison C is obtained as follows, for example, with respect to each one of the reference levels VO:

When the comparator 12a judges that the voltage level of the waveform B is below the reference level VO at a reference timing, it outputs a 0 (zero) as the result of comparison; otherwise, it outputs a 1 (one). Let us assume here for explanation's sake that the level of the waveform B is above the reference level VO between time points t1 and t2 as shown in FIG. 8, and is below before time point t1 and after time point t2; then, the comparator 12a outputs a series of 0's before the time t1 and after the time t2, and a series of 1's therebetween, at the respective reference times as determined by the strobe signal T, the period of which is set, as pointed out above, at a value substantially smaller than the period of the waveform B. Thus a row consisting of 0's and 1's is obtained as the result of comparison with respect to a reference output voltage level VO. This row of 0's and 1's represents one dimensional waveform data. (In FIG. 7, the result 0 is represented by an * and the result 1 by a space, above the arrow at C and within the block 13.)

The reference level VO utilized by the comparator 12a is set variably by a reference level changing means 15. Namely, the level VO is set successively to a new level as a waveform B is repeated by the means 14. That is, the value of the reference level VO increases or decreases stepwise with a small increment or decrement each time a waveform B is repeated. Thus, level VO varies over N levels ranging over the possible voltage range of the waveform B, the number of N of the reference levels VO being equal to the number of the repetition N of the waveform B.

Figure 1:
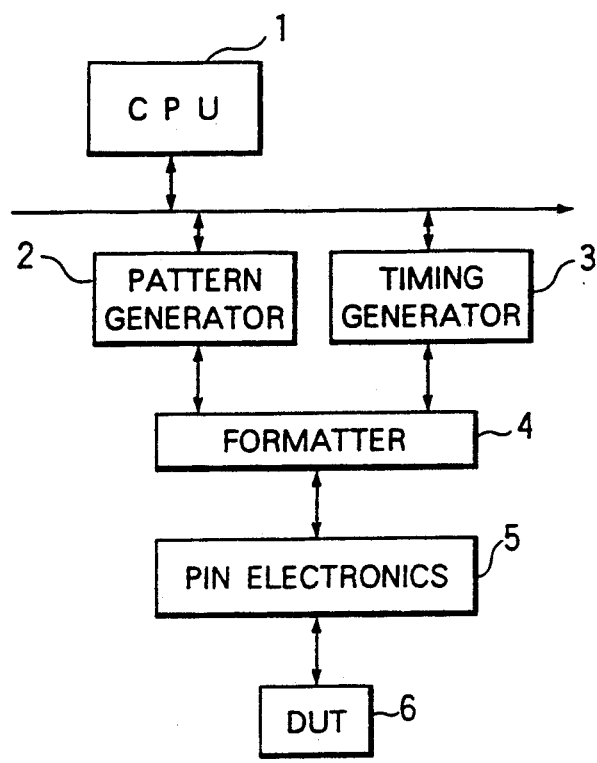
FIG. 1 is a diagram showing the overall organization of a tester for semiconductor devices.
Figure 2:
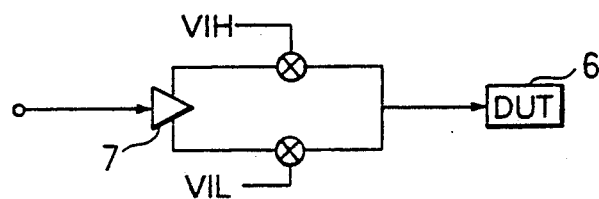
FIG. 2 is a block diagram showing the functional organization of a driver of a tester.
Figure 3:
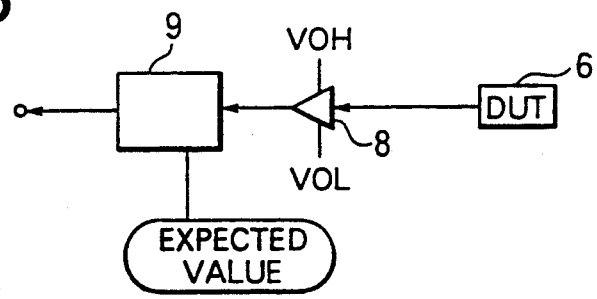
FIGS. 3 and 4 are block diagrams showing the functional organization of a comparator of a tester.
Figure 5:
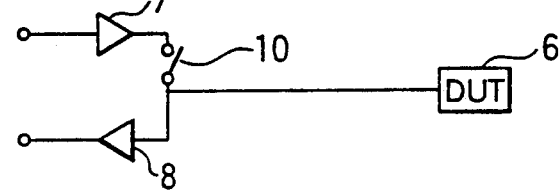
FIG. 5 is a block diagram showing an interface circuit provided for each one of the pins of a conventional tester with the test wavefrom monitoring function.

It is noted that the functions of the blocks 14 through 16 of FIG. 7 as described above may be effected by the circuitry or program of the computer comprised by the tester for semiconductor devices which is shown in FIG. 1.

Figure 9:
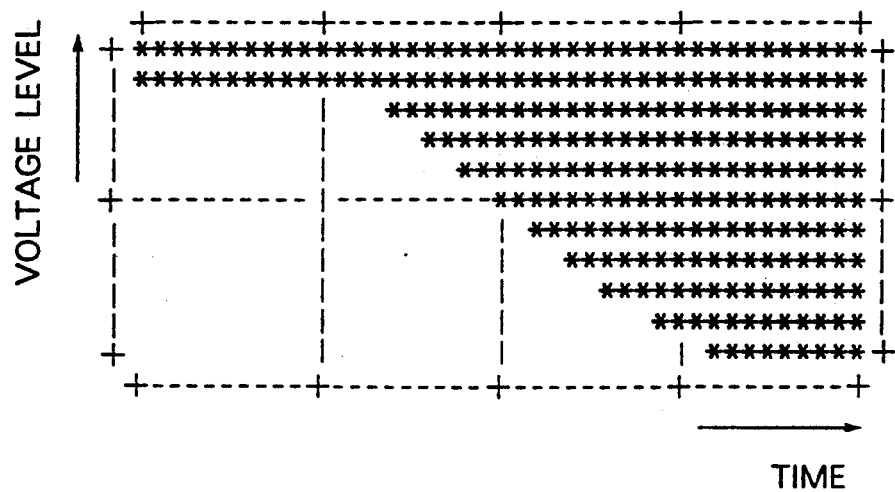
FIG. 9 shows an example of a two dimensional image of a waveform displayed on a CRT according to the invention.

The memory and display means 13 comprises a memory means, a memory of the tester, and a two dimensional display means, which is a console (CRT) of the tester. The memory means stores the rows C of the results of comparison judgements (i.e., the one dimensional waveform data) with respect to respective reference voltage levels VO. The two dimensional display means composes these one dimensional waveform data, so as to simulate and display as a two dimensional image the waveform A. Namely, the display means stacks the rows of 0's and 1's, one on the other, into a matrix, thereby producing a two dimensional image of the original waveform A. FIG. 9 shows an example of the two dimensional image obtained as above, wherein 0's are represented by asterisks and 1's by spaces. The horizontal spacings between the asterisks in FIG. 9 correspond to the period (predetermined time interval) between successive reference times determined by the strobe T. The vertical spacings therebetween correspond to the difference between the respective levels of the reference voltage levels VO. Incidentally, the method of waveform display by means of the correlated two dimensional plot diagram as shown in FIG. 9 is generally known as SHMOO.

While description has been made of the particular embodiment of this invention, it will be understood that many modifications may be made without departing from the spirit thereof. For example, the above embodiment comprises only one comparator 12 for simulating the test waveform. The tester, however, may comprise a plurality of comparators for waveform simulation, such that the distances from respective drivers 7 to the comparators 12 may be selected at values at which the respective test waveforms input to the device under test 6 can be simulated with precision. Then, it becomes possible to simulate the details of the waveforms including ringing, overshoot, and undershoot thereof. Further, the method of display of the waveforms is not limited to SHMOO as described above; the waveforms may be represented as curves similar to those displayed by an oscilloscope. The appended claims are contemplated to cover any such modifications as fall within the true spirit and scope of this invention.

What is claimed is:

1. A semiconductor device tester including:
   a plurality of drivers for outputting respective test waveforms for input to respective pins of a semiconductor device under test for producing output signals from the semiconductor device in response to the test waveforms for comparison with expected value patterns to test the functioning of the semiconductor device under test;
   driver output selecting means for selecting the output test waveform of at least one of the plurality of drivers; waveform display means, coupled to said driver output selecting means, for displaying the test waveform output by the driver selected by the driver output selecting means; and
   waveform holding and repeating means, coupled to the driver output selecting means, for holding a test waveform output by the driver selected by the driver output selecting means and for repeatedly outputting the same waveform.

2. A tester as claimed in claim 1 comprising:
   comparing means, coupled to the waveform holding and selecting means, for comparing with a reference level the test waveform output from the waveform holding and repeating means at each of a plurality of reference times recurring at a predetermined time interval that is substantially smaller than the period of the test waveform output from the waveform holding and repeating means and for generating, for each comparison and reference level, a stream of data bits representing respective determinations of whether the test waveform exceeded the reference level; and
   reference level varying means for successively varying the reference level each time the test waveform is repeated by the waveform holding and repeating means.

3. A tester as claimed in claim 2, wherein said driver output selecting means comprises relays selectively connecting respective drivers to said comparing means.

4. A semiconductor device tester including:
   a plurality of drivers for outputting respective test waveforms, each having a respective period, for input to respective pins of a semiconductor device under test for producing output signals from the semiconductor device in response to the test waveforms for comparing with expected value patterns to test the functioning of the semiconductor device under test;
   driver output selecting means for selecting the output test waveform of at least one of the plurality of drivers;
   waveform holding and repeating means, coupled to the driver output selecting means, for holding a test waveform output by the driver selected by the driver output selecting means and for repeatedly outputting the same waveform; and
   waveform display means, coupled to said driver output selecting means, for displaying the test waveform output by the driver selected by the driver output selecting means.

5. A semiconductor device tester including:
   a plurality of drivers for outputting respective test waveforms, each having a respective period, for input to respective pins of a semiconductor device under test;
   comparing means for comparing output signals from the semiconductor device in response to the test waveforms with expected value patterns to test the functioning of the semiconductor device under test;
   driver output selecting means for selecting the output test waveform of at least one of the plurality of drivers; and
   waveform display means, coupled to said driver output selecting means, for displaying the test waveform output by the driver selected by the driver output selecting means, said waveform display means comprising:
   waveform holding and repeating means, coupled to the driver output selecting means, for holding a test waveform output by the driver selected by the driver output selecting means and for repeatedly outputting the same waveform and comparing means coupled to the waveform holding and selecting means for comparing with a reference level the test waveform output from the waveform holding and repeating means at each of a plurality of reference times recurring at a predetermined time interval that is substantially smaller than the period of the test waveform output from the waveform holding and repeating means and for generating, for each comparison and reference level, a stream of data bits representing respective determinations of whether the test waveform exceeded the reference level;

reference level varying means for successively varying the reference level each time the test waveform is repeated by the waveform holding and repeating means;

memory means, coupled to the comparison means, for storing successive streams of the data bits generated by the comparing means; and two dimensional display means, coupled to the memory means, for displaying the streams of data bits in successive rows to simulate and display the test waveform as a two dimensional image.

6. A tester as claimed in claim 4, wherein said driver output selecting means comprises relays which selectively connect respective drivers to the comparing means.

7. A tester as claimed in claim 5, wherein said comparing means comprises a comparator provided exclusively for simulating the test waveforms.

* * * * *